(12) United States Patent
Leobandung

(10) Patent No.: US 10,096,689 B2
(45) Date of Patent: *Oct. 9, 2018

(54) LOW END PARASITIC CAPACITANCE FINFET

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/265,905

(22) Filed: Sep. 15, 2016

(65) Prior Publication Data

US 2017/0005092 A1  Jan. 5, 2017

Related U.S. Application Data

(63) Continuation of application No. 14/590,109, filed on Jan. 6, 2015, now Pat. No. 9,564,506.

(51) Int. Cl.
*H01L 29/51* (2006.01)
*H01L 21/762* (2006.01)
(Continued)

(52) U.S. Cl.
CPC ........ *H01L 29/51* (2013.01); *H01L 21/31144* (2013.01); *H01L 21/76224* (2013.01);
(Continued)

(58) Field of Classification Search
CPC ............. H01L 29/51; H01L 21/823431; H01L 21/823475; H01L 21/31144; H01L 27/0886; H01L 21/76897; H01L 29/7856; H01L 29/495; H01L 21/76224; H01L 21/76879; H01L 21/76829; H01L 29/66553
See application file for complete search history.

(56) References Cited

U.S. PATENT DOCUMENTS

| 5,643,815 | A | 7/1997 | Vu et al. |
| 7,408,223 | B2 | 8/2008 | Hueting |

(Continued)

FOREIGN PATENT DOCUMENTS

JP  4457688 B2  4/2010

OTHER PUBLICATIONS

List of IBM Patents or Patent Applications Treated as Related; Dated Sep. 15, 2016; 2 pages.

*Primary Examiner* — John P Dulka
(74) *Attorney, Agent, or Firm* — Alexa L. Ashworth; Brian M. Restauro

(57) ABSTRACT

Embodiments of the present invention provide methods for fabricating a semiconductor device. One method may include providing a semiconductor substrate with fins etched into the semiconductor substrate; forming a gate structure and depositing an insulating material around the gate structure; selectively etching an active device area; forming a set of spacers on the sides of the gate structure; growing a doped source and drain region; depositing an insulator over an upper surface of a deposited etch stop layer; and depositing a metal into a contact opening to form one or more contacts.

19 Claims, 17 Drawing Sheets

(51) Int. Cl.
   *H01L 21/768*   (2006.01)
   *H01L 29/66*    (2006.01)
   *H01L 29/49*    (2006.01)
   *H01L 29/78*    (2006.01)
   *H01L 21/311*   (2006.01)
   *H01L 21/8234*  (2006.01)
   *H01L 27/088*   (2006.01)

(52) U.S. Cl.
   CPC .. *H01L 21/76829* (2013.01); *H01L 21/76879* (2013.01); *H01L 21/76897* (2013.01); *H01L 21/823431* (2013.01); *H01L 21/823475* (2013.01); *H01L 27/0886* (2013.01); *H01L 29/495* (2013.01); *H01L 29/66553* (2013.01); *H01L 29/7856* (2013.01)

(56) References Cited

U.S. PATENT DOCUMENTS

| | | |
|---|---|---|
| 7,511,360 B2 | 3/2009 | Shroff et al. |
| 7,709,910 B2 | 5/2010 | Henson et al. |
| 8,030,202 B1 | 10/2011 | Horak et al. |
| 8,080,838 B2 | 12/2011 | Chang et al. |
| 9,564,506 B2* | 2/2017 | Leobandung ..... H01L 21/31144 |
| 2008/0258234 A1 | 10/2008 | Henson et al. |
| 2011/0081766 A1* | 4/2011 | Liu ................... H01L 21/76232 |
| | | 438/424 |
| 2011/0133297 A1 | 6/2011 | Franosch et al. |
| 2012/0032275 A1* | 2/2012 | Haran ............... H01L 21/28518 |
| | | 257/401 |
| 2012/0037962 A1 | 2/2012 | Breyta et al. |
| 2013/0049115 A1 | 2/2013 | Cheng et al. |
| 2013/0168840 A1 | 7/2013 | Merassi et al. |
| 2013/0249006 A1 | 9/2013 | Khakifirooz et al. |
| 2014/0103450 A1 | 4/2014 | Cheng et al. |
| 2014/0284667 A1* | 9/2014 | Basker ................ H01L 29/6681 |
| | | 257/288 |
| 2016/0197158 A1 | 7/2016 | Leobandung |

* cited by examiner

LOW END PARASITIC CAPACITANCE FINFET

BACKGROUND OF THE INVENTION

The present invention relates generally to semiconductor devices, and more particularly to the formation of FinFET devices with reduced gate-to-contact end parasitic capacitance.

Semiconductor devices generally include a plurality of circuits which form an integrated circuit fabricated on a semiconductor substrate. To improve the performance of the circuits, low k dielectric materials, having a dielectric constant of less than silicon dioxide, are used between circuits as inter-layer dielectric (ILD) to reduce capacitance. Interconnect structures made of metal lines are usually formed in and around the ILD material to connect elements of the circuits. Within a typical interconnect structure, metal lines run parallel to the semiconductor substrate. An interconnect structure may consist of multilevel or multilayered schemes, such as, single or dual damascene wiring structures.

Gate-to-contact parasitic capacitance in integrated circuits (ICs) may contribute to increased power consumption and reduced device performance and speed. Typically, spacers formed on gate sidewalls employ silicon nitride; however, silicon nitride has a relatively high dielectric constant and thus, results in high gate parasitic capacitances. Spacers composed of an oxide material have been used to reduce the parasitic capacitance. Spacers composed of a nitride material can also be used, and later removed and replaced with lower-capacitance materials, such as an oxide. Such parasitic capacitances can increase device power consumption and can impact device performance.

SUMMARY

According to one embodiment of the present invention, a method for fabricating a semiconductor device is provided, the method comprising: providing a semiconductor substrate comprising a plurality of fins etched in the semiconductor substrate; forming a set of gate structures; depositing a first insulating material between the set of gate structures; selectively etching an active device area; depositing an oxide material over a top surface of the active device area; removing the first insulating material selective to the plurality of fins; forming a set of spacers adjacent to the set of gate structures; growing a doped source and drain region adjacent to the plurality of fins; depositing an etch stop layer over an upper surface of the deposited oxide material; depositing a second insulating material over an upper surface of the deposited etch stop layer; and depositing a metal within a contact opening to form a plurality of contacts.

According to another embodiment of the present invention, a semiconductor structure is provided, the semiconductor structure comprising: a plurality of fins patterned in a starting semiconductor substrate; a set of gate structures formed on the starting substrate; a set of spacers formed around each of the set of gate structures; a source and drain region grown around the plurality of fins; an insulating material, wherein the insulating material is configured to be deposited over an upper surface of an active semiconductor device area; and a plurality of contacts, wherein the plurality of contacts are positioned above the active semiconductor device area.

DETAILED DESCRIPTION

Figure 1A:
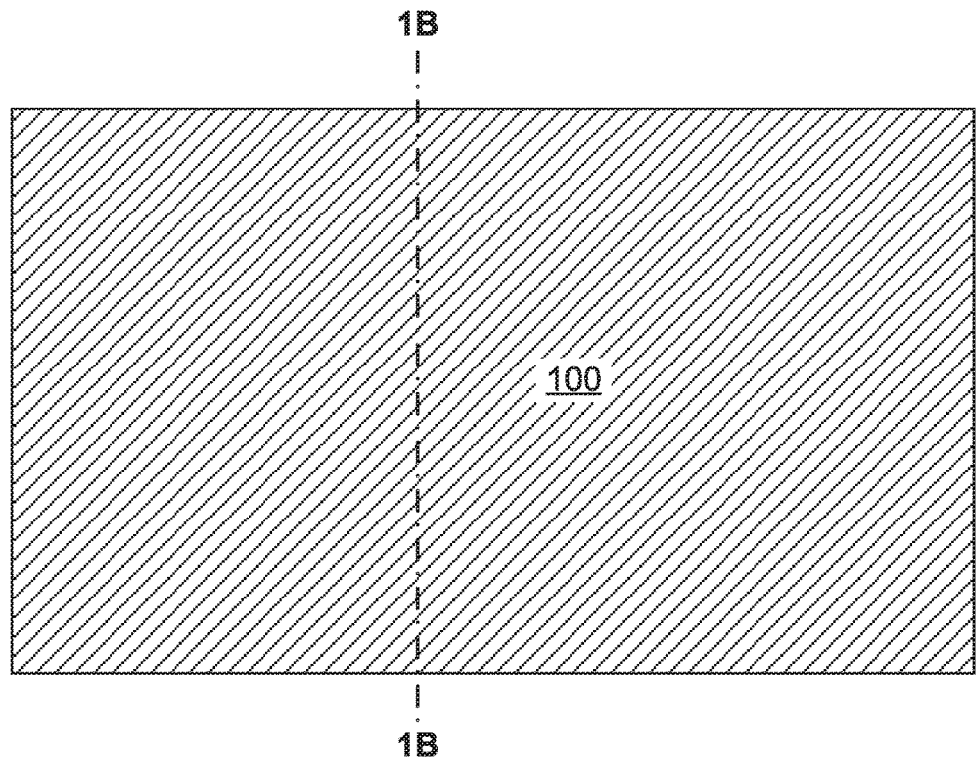
FIGS. 1A and 1B depict a plan view and a cross-sectional view of a starting semiconductor substrate after the formation of a set of fins, in accordance with an embodiment of the present invention.

Embodiments of the present invention provide a FinFET device with reduced gate-to-contact end parasitic capacitance. The gate and the contact of a semiconductor device, due to proximity, may have parasitic capacitance associated with them. Embodiments of the present invention recognize that the parasitic capacitance may be reduced when the gate and the contact are extended beyond the active device area.

Detailed description of embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "on", "over", "overlying", "atop", "positioned on", or "positioned atop" mean that a first element, such as a first structure, is present on a second element, such as a second structure, wherein intervening elements, such as an interface structure, may be present between the first element and the second element. The terms "direct contact", "directly on", or "directly over" mean that a first element, such as a first structure, and a second element, such as a second structure, are connected without any intermediary conducting, insulating, or semiconductor layers at the interface of the two elements. The terms "connected" or "coupled" mean that one element is directly connected or coupled to another element, or intervening elements may be present. The terms "directly connected" or "directly coupled" mean that one element is connected or coupled to another element without any intermediary elements present.

Figure 1B:
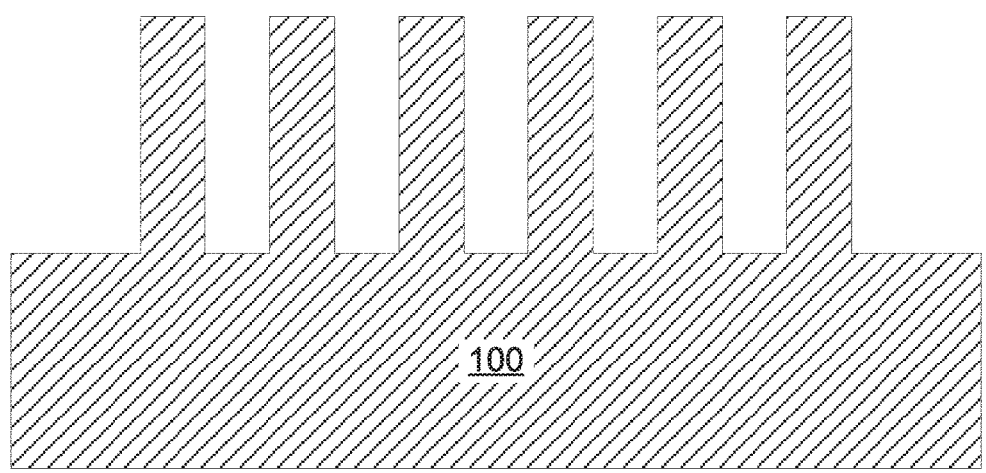

Referring now to the figures, FIG. 1A is a plan view of a starting semiconductor substrate 100 after the formation of a set of fins, and FIG. 1B is a cross-sectional view of the starting semiconductor substrate 100 after the formation of a set of fins, taken along the line 1B-1B of FIG. 1A. In this exemplary embodiment, substrate 100 is composed of silicon. In other embodiments, substrate 100 may be composed of other semiconductor substrate materials, such as III-V semiconductor materials, II-VI semiconductor materials, Ge, and SiGe. The fins are defined on substrate 100 using any standard etching processes know in the art. For example, fin patterns may be formed and etched into substrate 100 using known photolithography techniques.

Figure 2A:
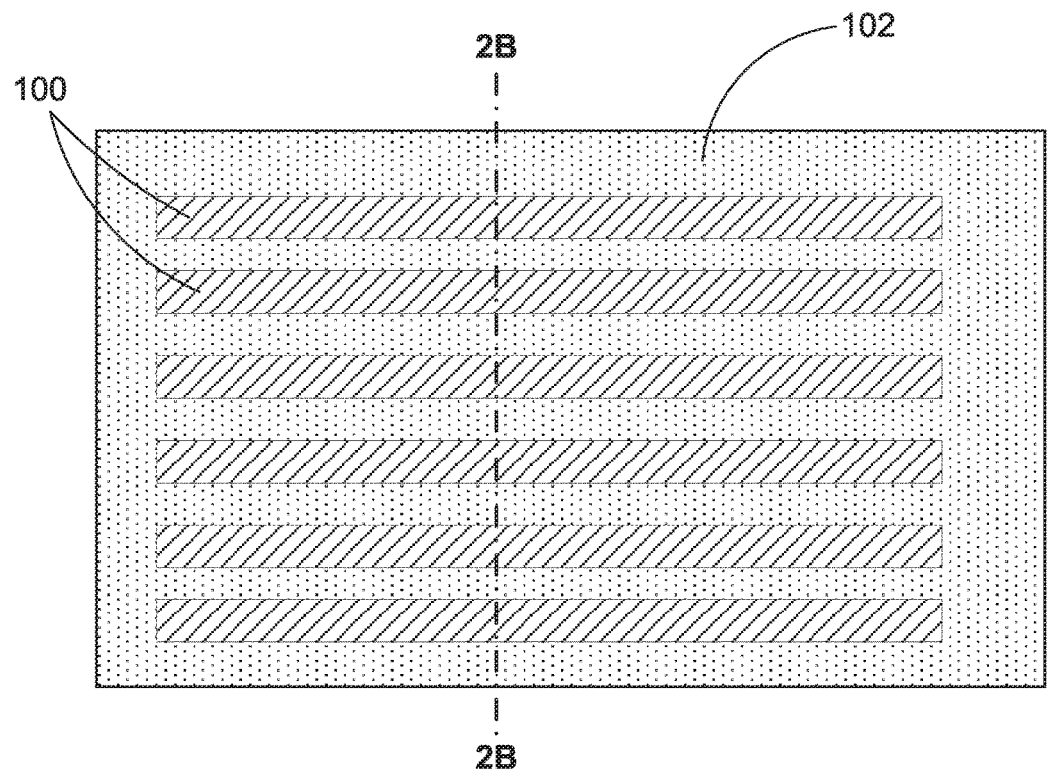
FIGS. 2A and 2B depict a plan view and a cross-sectional view of the semiconductor device after the creation of device regions on the starting semiconductor substrate of FIGS. 1A and 1B through shallow trench isolation (STI), in accordance with an embodiment of the present invention.
Figure 2B:
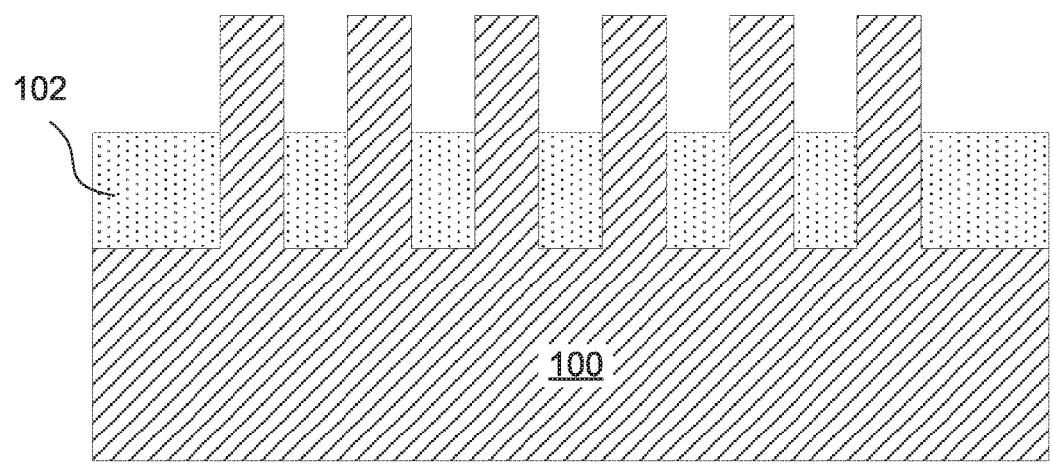

Referring now to FIGS. 2A and 2B, FIG. 2A depicts a plan view of the semiconductor device after the creation of device regions on starting semiconductor substrate 100 of FIGS. 1A and 1B through shallow trench isolation (STI), and FIG. 2B is a cross-sectional view of the semiconductor device after the creation of device regions on starting semiconductor substrate 100 of FIGS. 1A and 1B, taken along the line 2B-2B of FIG. 2A. In this exemplary embodiment, device regions are created through shallow trench isolation (STI) within substrate 100. In a preferred embodiment, the shallow trenches are filled with one or more insulating materials 102, such as $SiO_2$ or other oxide materials, to isolate the fins from each other. This prevents electrical leakage between adjacent semiconductor device components, preventing one device region from affecting another device region or shorting out through contact with another. After the deposition of insulating materials 102, a standard planarization process known in the art may be performed, such as chemical mechanical polishing (CMP) and/or grinding.

Figure 3A:
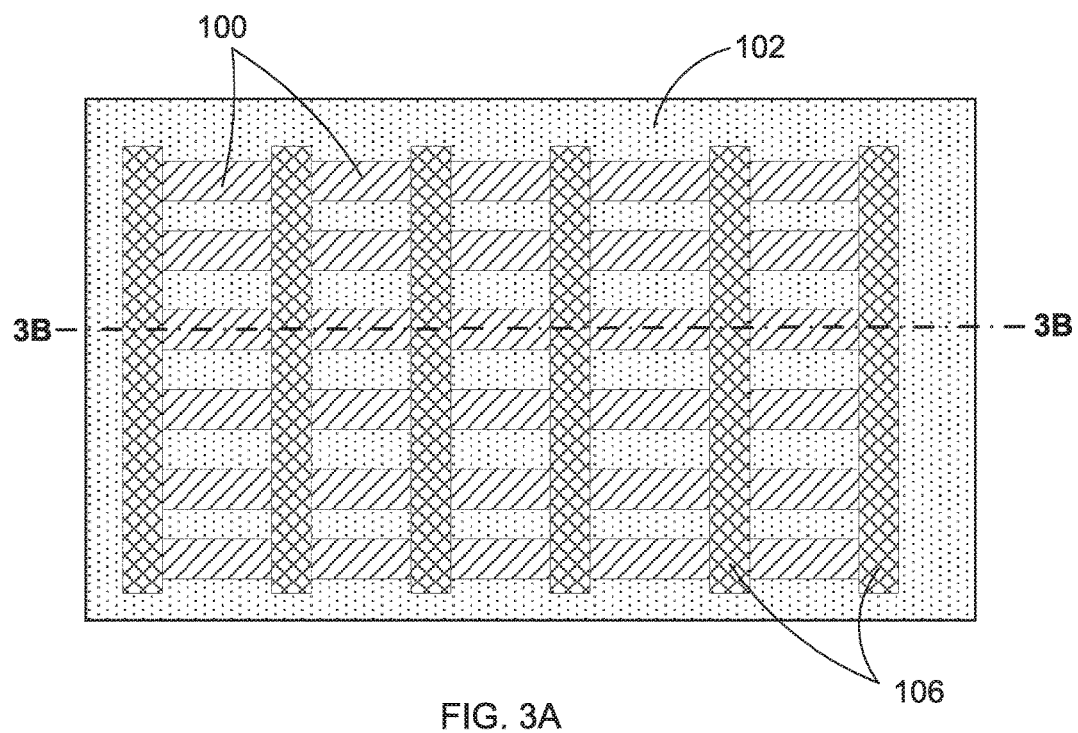
FIGS. 3A and 3B depict a plan view and a cross-sectional view of the semiconductor device after the formation of gate structures, in accordance with an embodiment of the present invention.
Figure 3B:
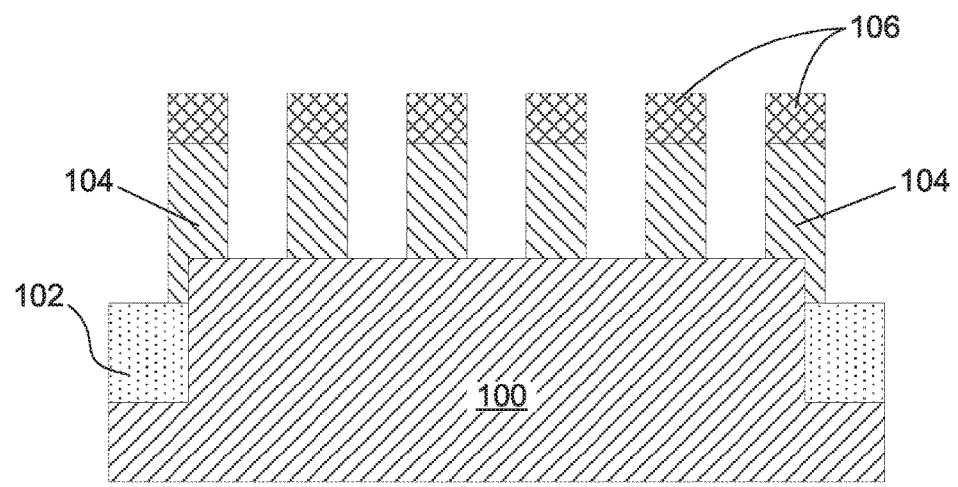

Referring now to FIGS. 3A and 3B, FIG. 3A depicts a plan view of the semiconductor device after the formation of gate structures 104, and FIG. 3B is a cross-sectional view of the semiconductor device after the formation of gate structures 104, taken along the line 3B-3B of FIG. 3A. Gate structures 104 are formed using a conventional deposition process including, for example, atomic layer deposition (ALD), molecular layer deposition (MLD), chemical vapor deposition (CVD), and physical vapor deposition (PVD), among other known processes. Gate structures 104 may be dummy gate structures or actual gate structures. In this exemplary embodiment, subsequent to the deposition of gate structures 104, a planarization process is performed to remove a portion of gate structures 104. The planarization process may be any conventional planarization process, such as CMP and/or grinding. Gate structures 104 are then patterned by lithography and etching. The lithographic and etching processes employed in patterning gate structures 104 may be the same as those mentioned above for patterning the fins. After formation of the patterned gate material 104, hard mask 106 is deposited using any suitable deposition technique known in the art, such as those discussed above, and patterned over gate structures 104. Hard mask 106 may be composed of, for example, an oxide material.

Figure 4A:
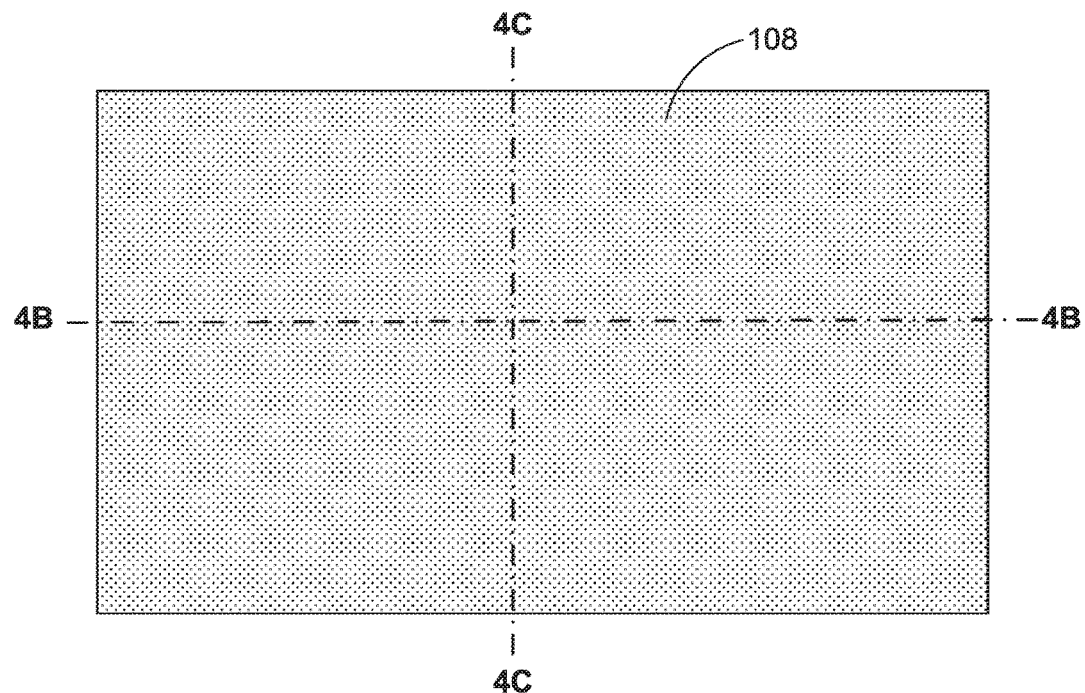
FIGS. 4A-C depict a plan view and cross-sectional views of the semiconductor device after depositing an insulating material between the gate structures of FIGS. 3A and 3B, in accordance with an embodiment of the present invention.
Figure 4B:
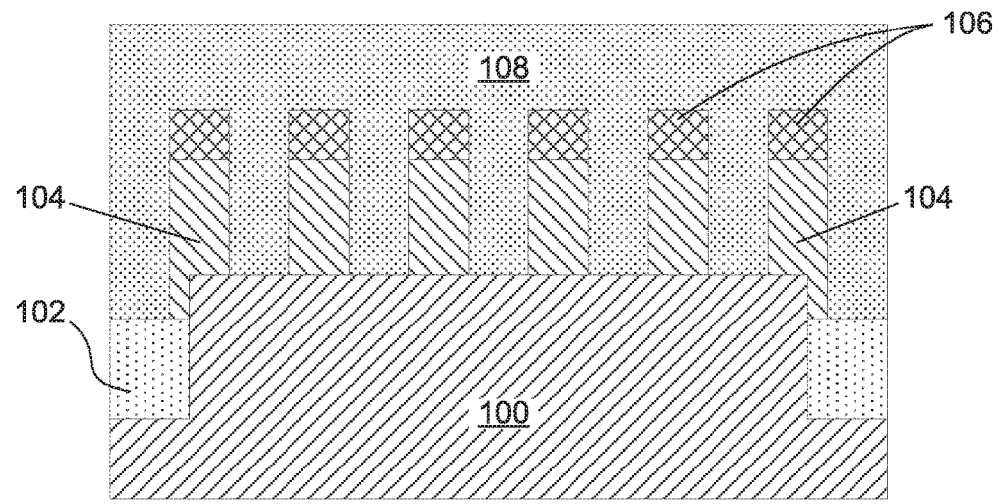
Figure 4C:
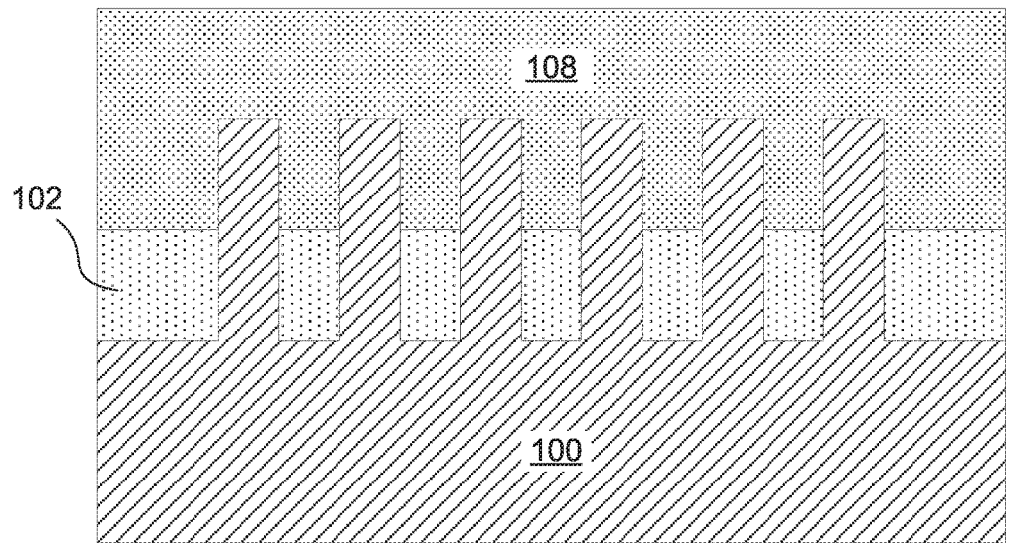

Referring now to FIGS. 4A-C, FIG. 4A depicts a plan view of the semiconductor device after depositing insulating material 108 between the gate structures of FIGS. 3A and 3B; FIG. 4B is a cross-sectional view of the semiconductor device after deposition insulating material 108 between the gate structures of FIGS. 3A and 3B, taken along the line 4B-4B of FIG. 4A; and FIG. 4C is a cross-sectional view of the semiconductor device after deposition insulating material 108 between the gate structures of FIGS. 3A and 3B, taken along the line 4C-4C of FIG. 4A. In this exemplary embodiment, insulating layer 108 is deposited over the exposed upper surfaces of the patterned gate structures 104 and between gate structures 104 using a known deposition process, such as CVD. In a preferred embodiment, insulating material 108 is composed of SiN. Following the deposition of insulating material 108, insulating material 108 is planarized using a conventional planarization process known in the art, such as one of the planarization processes mentioned above.

Figure 5A:
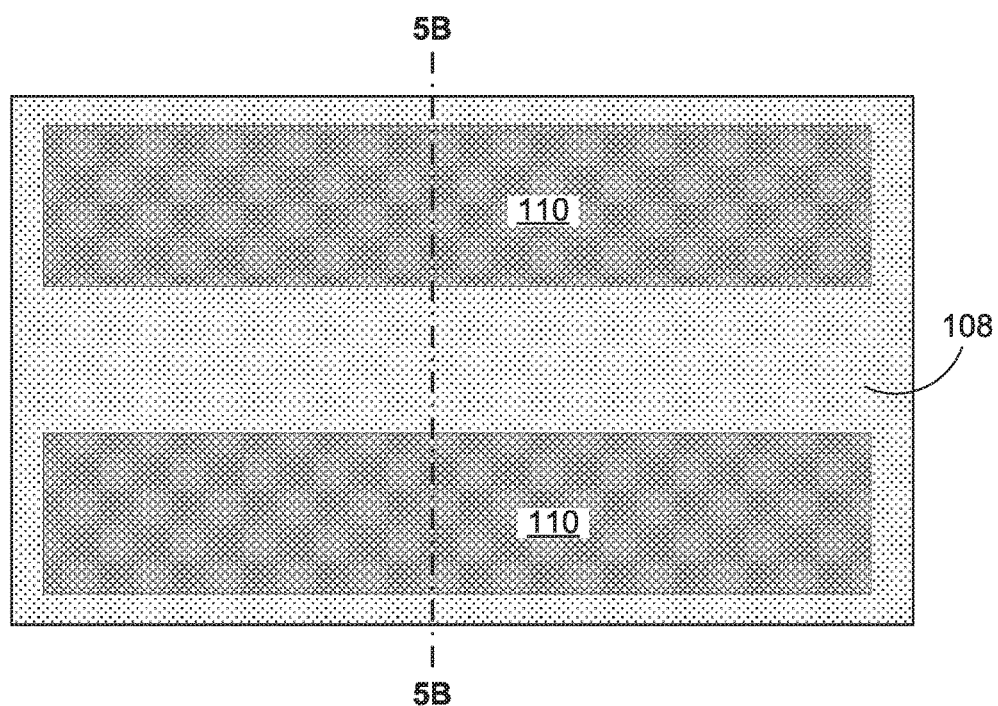
FIGS. 5A and 5B depict a plan view and a cross-sectional view of the semiconductor device after the patterning of the active device area, in accordance with an embodiment of the present invention.
Figure 5B:
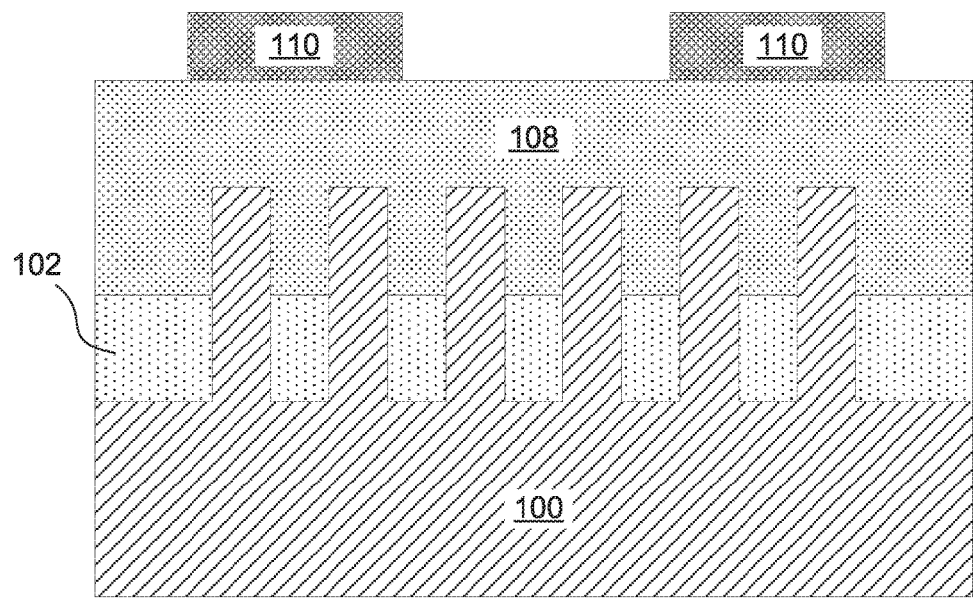

Referring now to FIGS. 5A and 5B, FIG. 5A depicts a plan view of the semiconductor device after the patterning of the active device area, and FIG. 5B is a cross-sectional view of the semiconductor device after the patterning of the active device area, taken along the line 5B-5B of FIG. 5A. In this exemplary embodiment, the active area of the semiconductor device is patterned using standard lithography techniques. For example, resist 110 may be patterned and deposited over the surface of insulating layer 108. The resist 110 cover region is used in the active device area for future processing steps.

Figure 6B:
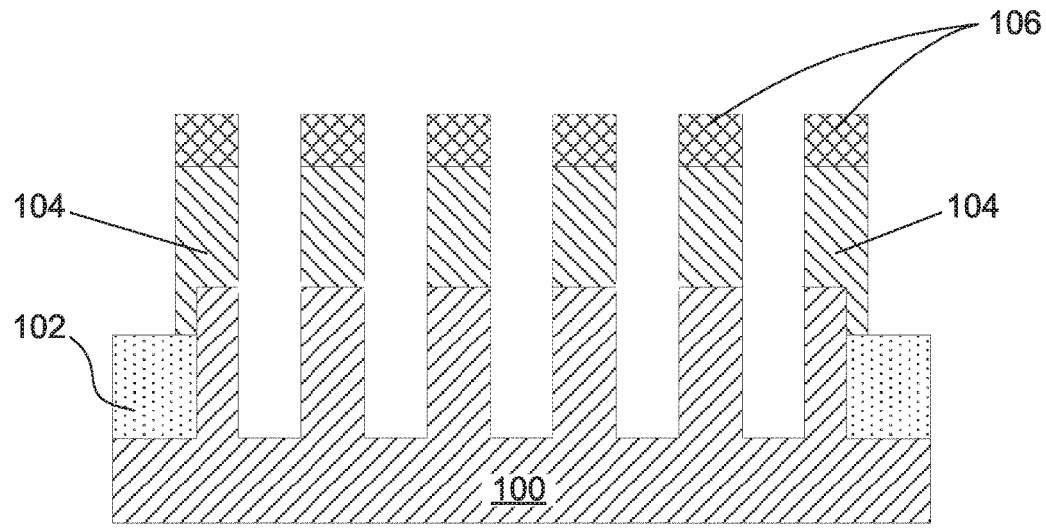
FIGS. 6A-C depict a plan view and cross-sectional views of the semiconductor device after etching the insulating material deposited in FIGS. 4A-C, in accordance with an embodiment of the present invention.
Figure 6C:
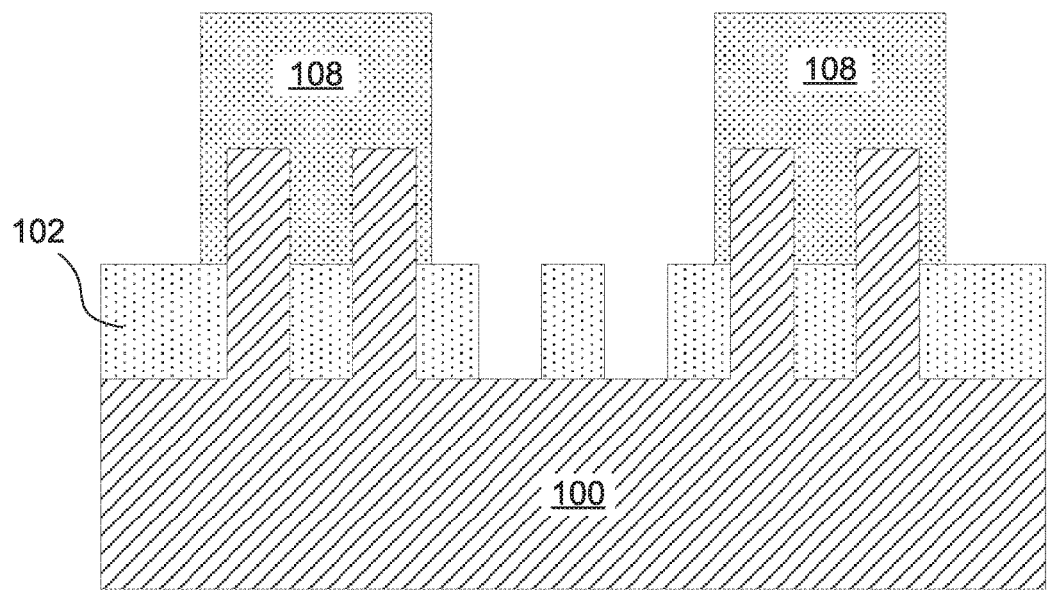
Figure 6A:
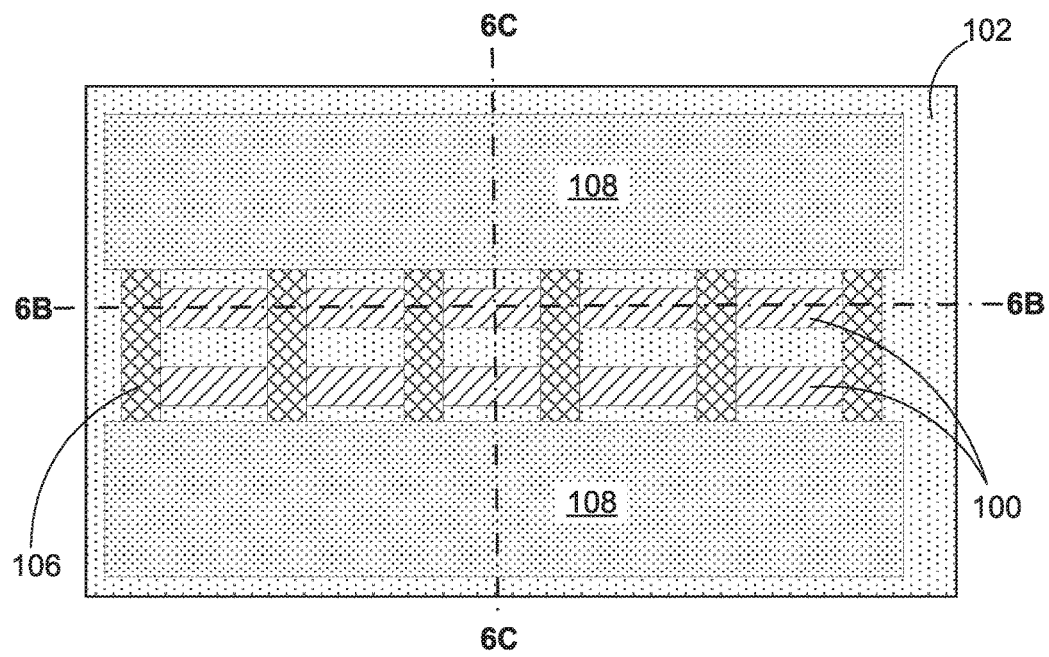

Referring now to FIGS. 6A-C, FIG. 6A depicts a plan view of the semiconductor device after etching insulating material 108 deposited in FIGS. 4A-C; FIG. 6B is a cross-sectional view of the semiconductor device after etching insulating material 108 deposited in FIGS. 4A-C, taken along the line 6B-6B of FIG. 6A; and FIG. 6C is a cross-sectional view of the semiconductor device after etching insulating material 108 deposited in FIGS. 4A-C, taken along the line 6C-6C of FIG. 6A. In this exemplary embodiment, insulating layer 108 and part of the fins are etched selective to resist 110 and insulating materials 102. Subsequent to etching the semiconductor device, resist 110 is stripped from the semiconductor device using any conventional removal process known in the art.

Figure 7A:
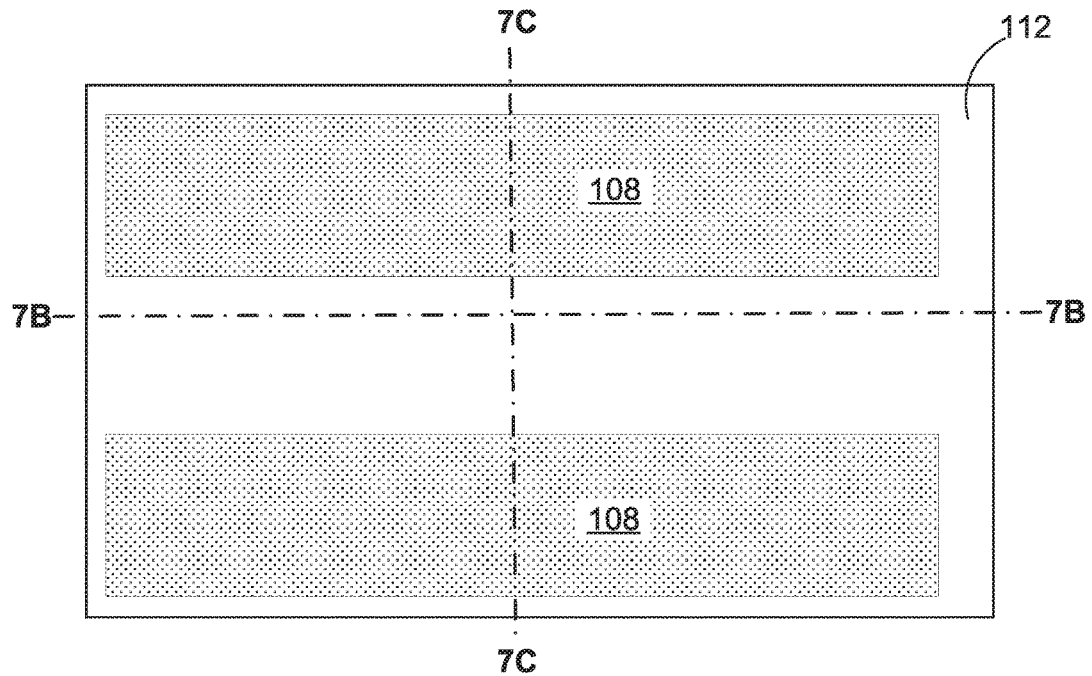
FIGS. 7A-C depict a plan view and cross-sectional views of the semiconductor device after depositing an oxide, in accordance with an embodiment of the present invention.
Figure 7B:
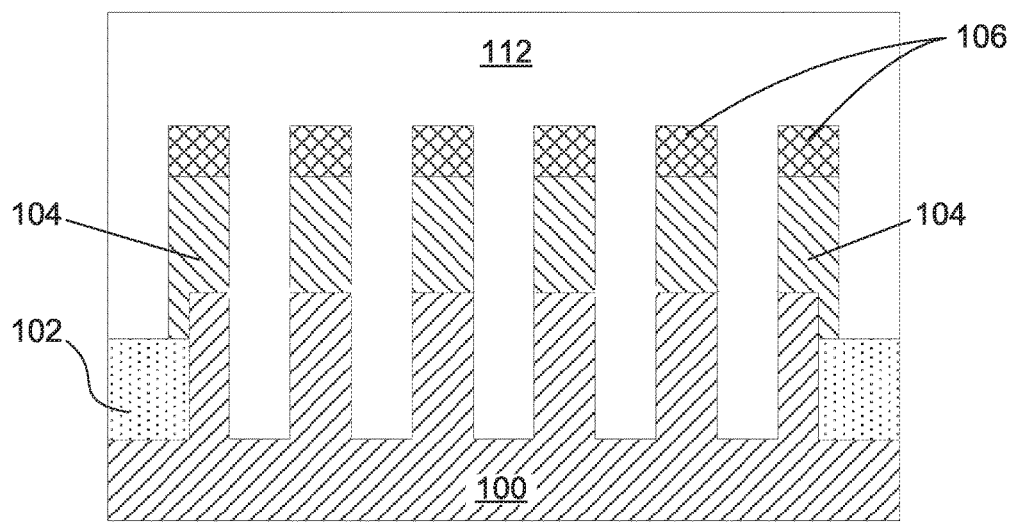
Figure 7C:
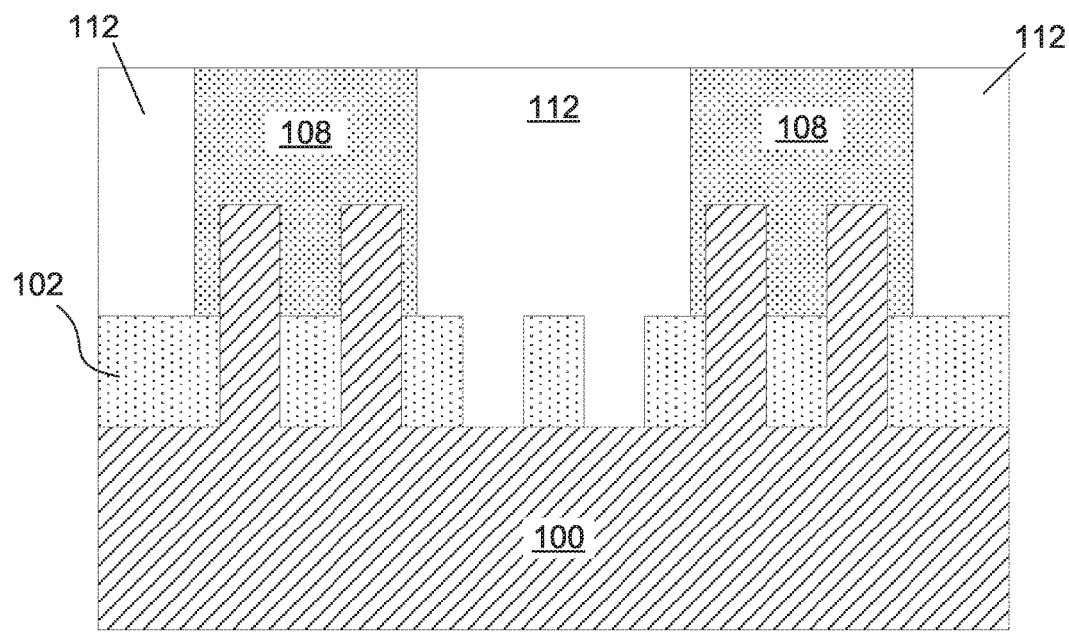

Referring now to FIGS. 7A-C, FIG. 7A depicts a plan view of the semiconductor device after depositing oxide 112; FIG. 7B is a cross-sectional view of the semiconductor device after depositing oxide 112, taken along the line 7B-7B of FIG. 7A; and FIG. 7C is a cross-sectional view of the semiconductor device after depositing oxide 112, taken along the line 7C-7C of FIG. 7A. In this exemplary embodiment, oxide 112 is deposited over the device regions. Oxide 112 may be deposited using, for example, CVD or any other known deposition techniques. Following the deposition of oxide 112, oxide 112 is planarized using a standard planarization method in the art, until the upper surfaces of insulator 108 are exposed and are substantially co-planar with the upper surface of oxide 112. In one embodiment, the planarization processes includes a conventional planarization technique as discussed above.

Figure 8A:
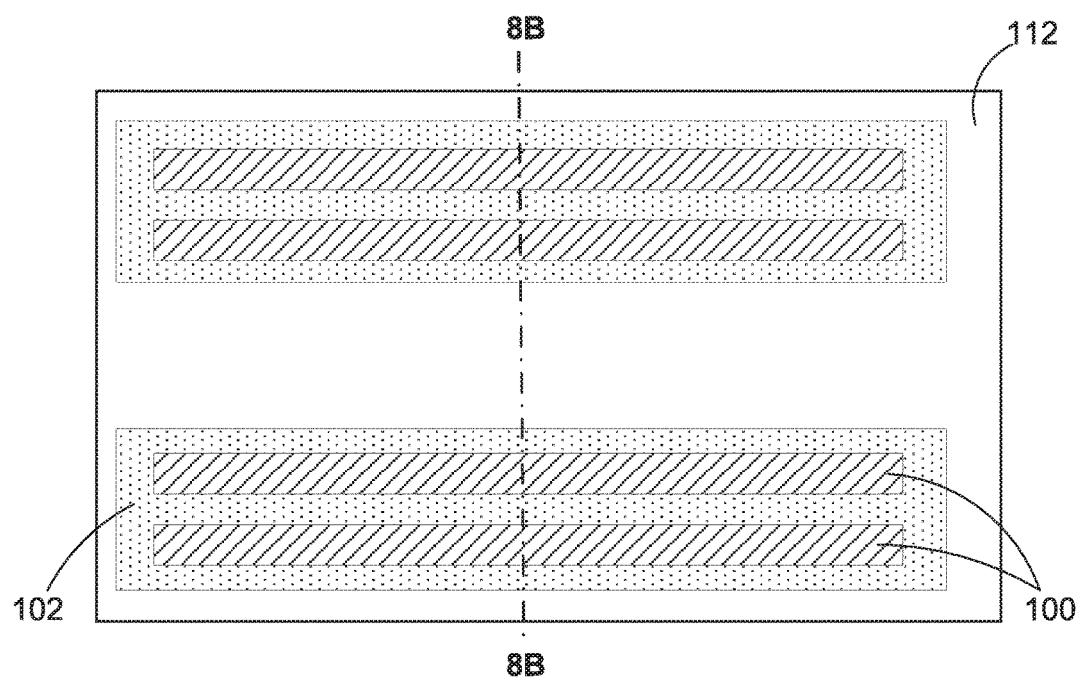
FIGS. 8A and 8B depict a plan view and a cross-sectional view of the semiconductor device after a wet etch removal process, in accordance with an embodiment of the present invention.
Figure 8B:
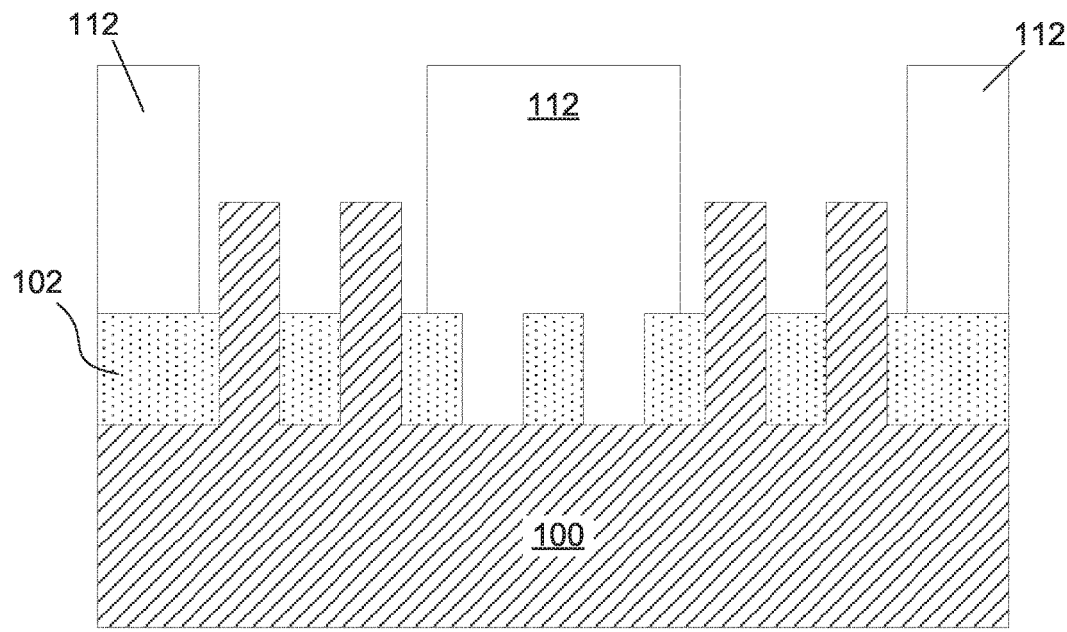

Referring now to FIGS. 8A and 8B, FIG. 8A depicts a plan view of the semiconductor device after a wet etch removal process, and FIG. 8B is a cross-sectional view of the semiconductor device after a wet etch removal process, taken along the line 8B-8B of FIG. 8A. In this exemplary embodiment, a hot phosphoric acid wet etch is used, where insulating material 108 is removed selective to the silicon composition of substrate 100 and the oxide composition of insulating materials 102. Hot phosphoric acid wet etch is an isotropic removal process performed with hot phosphoric acid ($H_3PO_4$). In this exemplary embodiment, the hot phosphoric acid wet etch is held at a temperature of approximately 150° C. for 1 minute to 10 minutes.

Figure 9A:
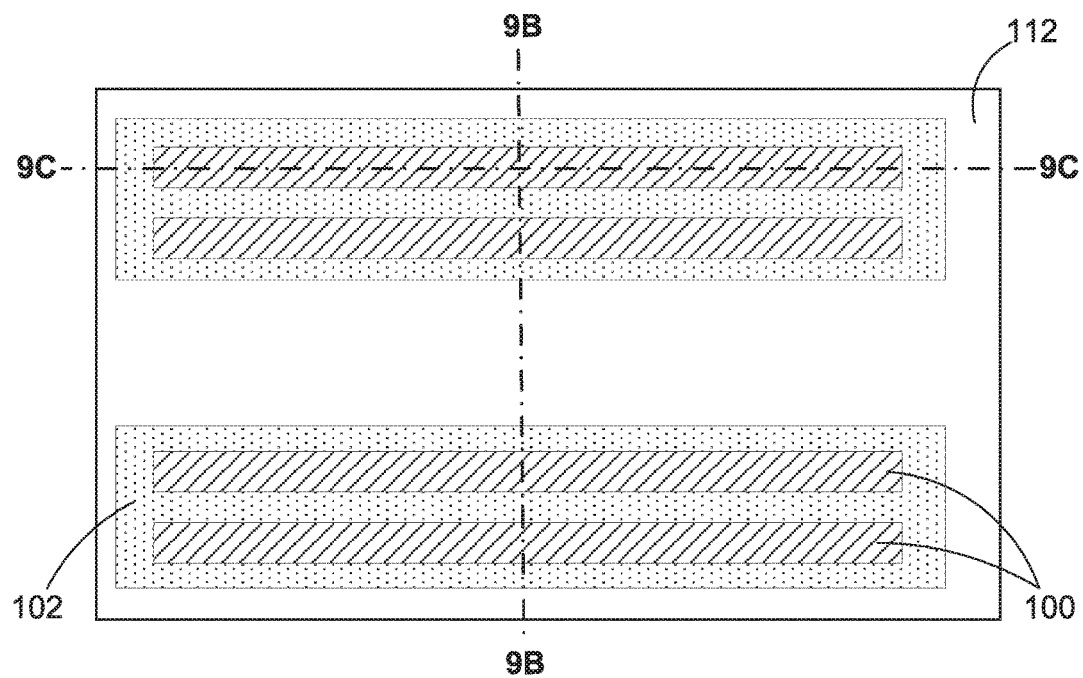
FIGS. 9A-C depict a plan view and cross-sectional views of the semiconductor device after the formation of spacers on the sides of the gate structures, in accordance with an embodiment of the present invention.
Figure 9B:
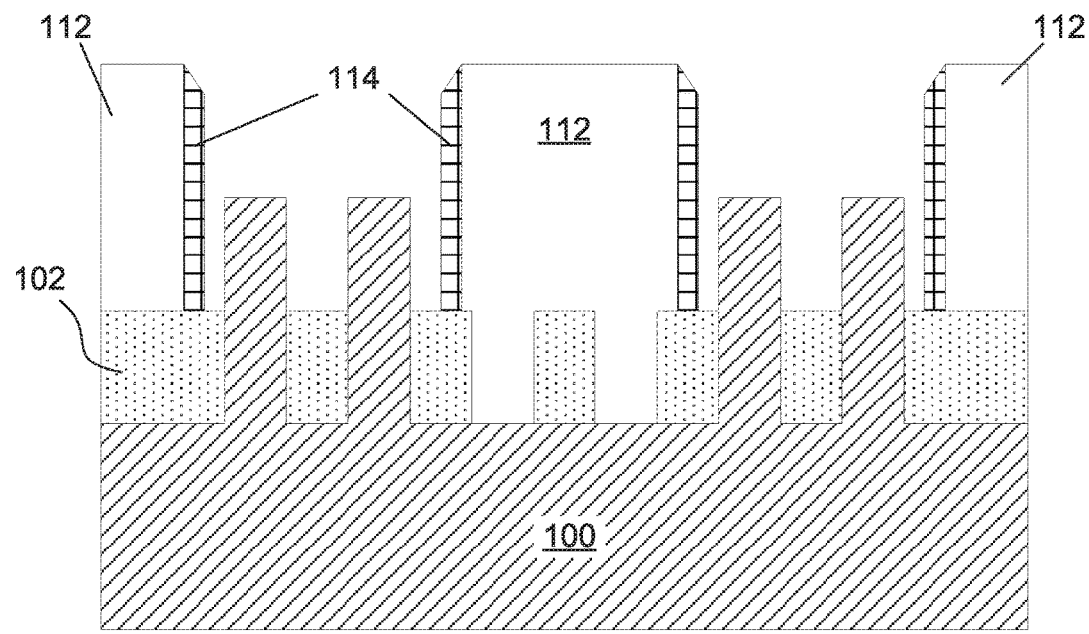
Figure 9C:
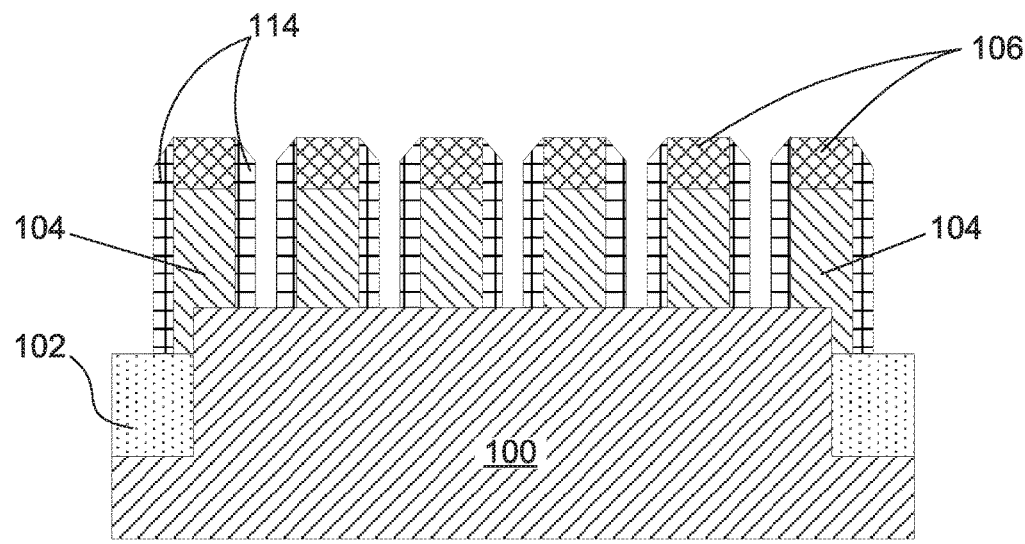

Referring now to FIGS. 9A-C, FIG. 9A depicts a plan view of the semiconductor device after the formation of spacers 114 on the sides of gate structures 104; FIG. 9B is a cross-sectional view of the semiconductor device after the formation of spacers 114 on the sides of gate structures 104, taken along the line 9B-9B of FIG. 9A; and FIG. 9C is a cross-sectional view of the semiconductor device after the formation of spacers 114 on the sides of gate structures 104, taken along the line 9C-9C of FIG. 9A. In this exemplary embodiment, spacers 114 are formed adjacent to gate structures 104 (i.e., in direct contact with the sidewall of gate structures 104), by a combination of deposition and etching techniques known in the art. Spacers 114 may be composed of a dielectric material, such as a nitride, an oxide, an oxynitride, or a combination thereof. In a preferred embodiment, spacers 114 are composed of a nitride. In other embodiments, an aggressive over etch using a reactive ion process is employed in the formation of spacers 114.

Figure 10A:
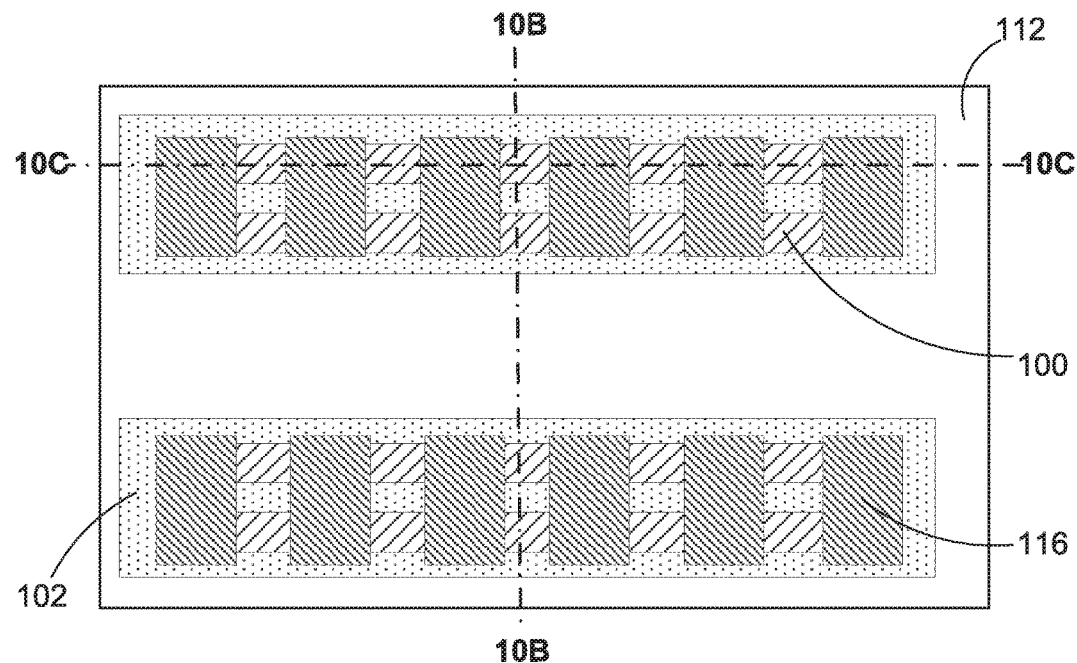
FIGS. 10A-C depict a plan view and cross-sectional views of the semiconductor device after the formation of the source and drain regions, in accordance with an embodiment of the present invention.
Figure 10B:
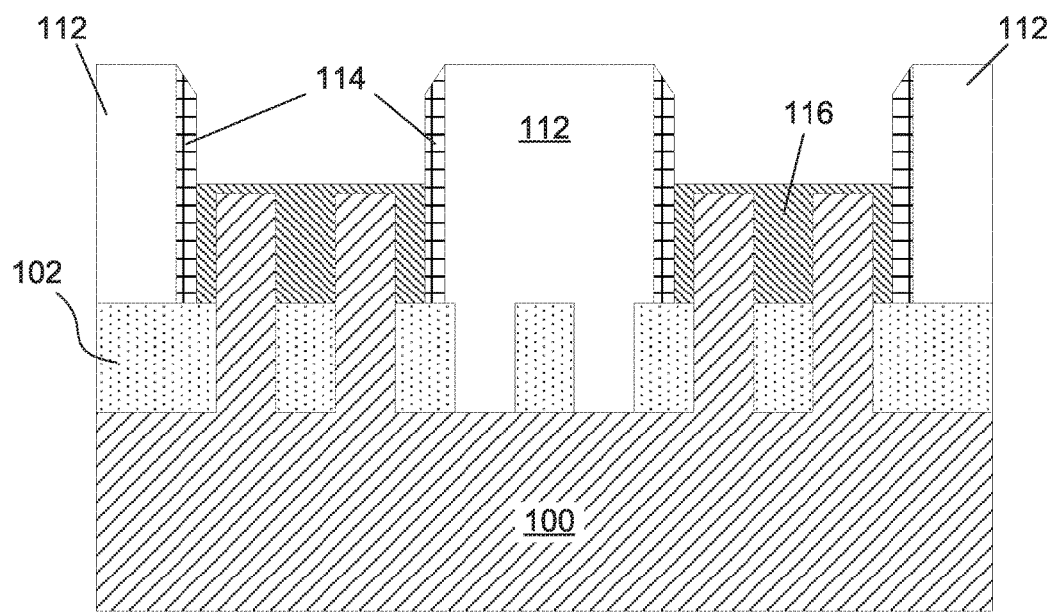
Figure 10C:
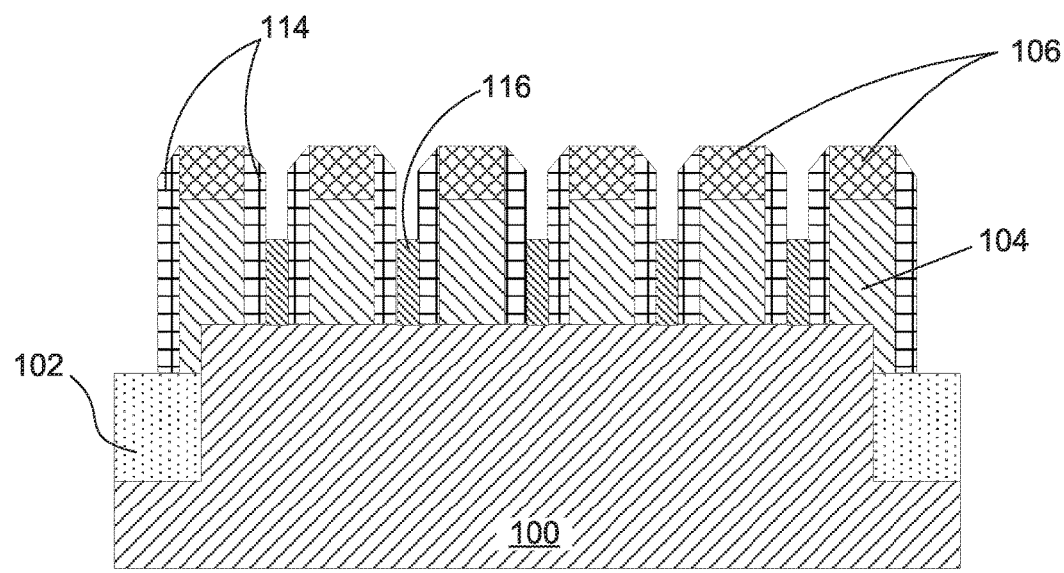

Referring now to FIGS. 10A-C, FIG. 10A depicts a plan view of the semiconductor device after the formation of source and drain regions 116; FIG. 10B is a cross-sectional view of the semiconductor device after the formation of source and drain regions 116, taken along the line 10B-10B of FIG. 10A; and FIG. 10C is a cross-sectional view of the semiconductor device after the formation of source and drain regions 116, taken along the line 10C-10C of FIG. 10A. In this exemplary embodiment, the growth of a doped epitaxial semiconductor layer for a source and drain extension (source and drain regions 116) is performed using a selective epitaxial growth process. The epitaxially grown semiconductor material typically comprises a Si-containing semiconductor material such as Si or SiGe. The source and drain regions 116 are grown using an n-dopant for an NFET and a p-dopant for a PFET. In other embodiments, the use of a doped diode implantation may be used to form a diode at source and drain regions 116.

Figure 11A:
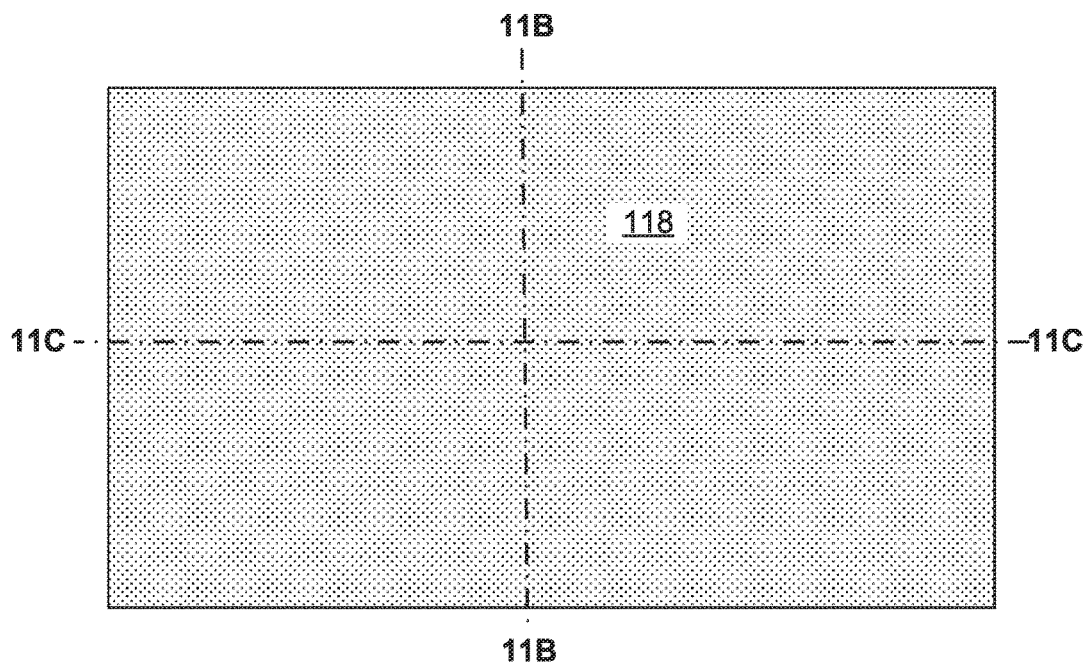
FIGS. 11A-C depict a plan view and cross-sectional views of the semiconductor device after the deposition of a cap layer, in accordance with an embodiment of the present invention.
Figure 11B:
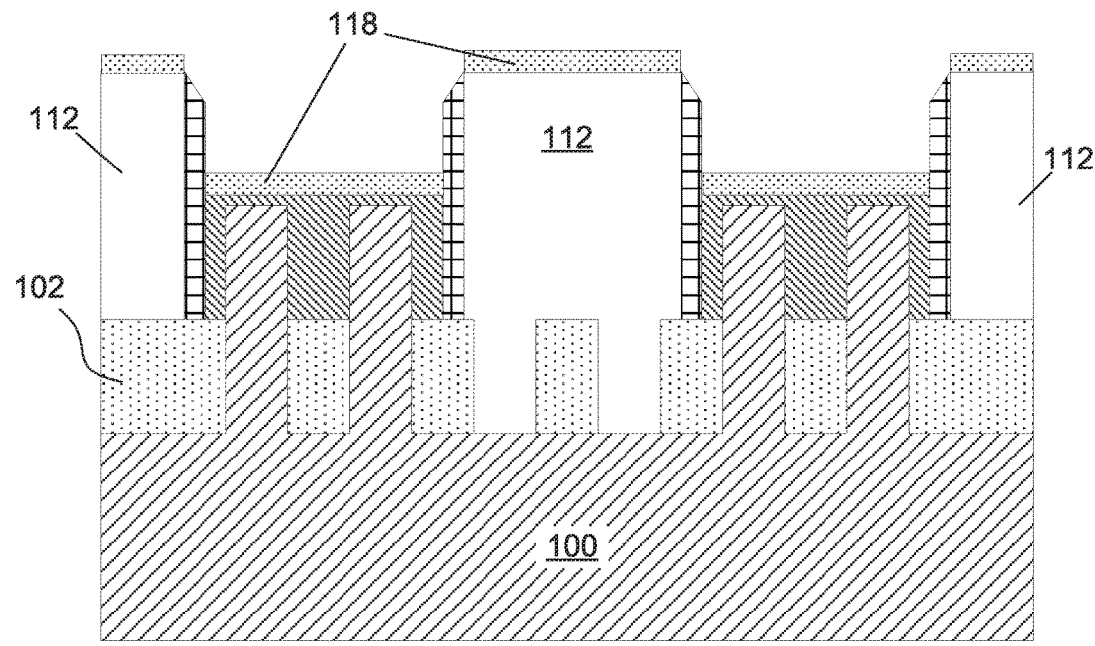
Figure 11C:
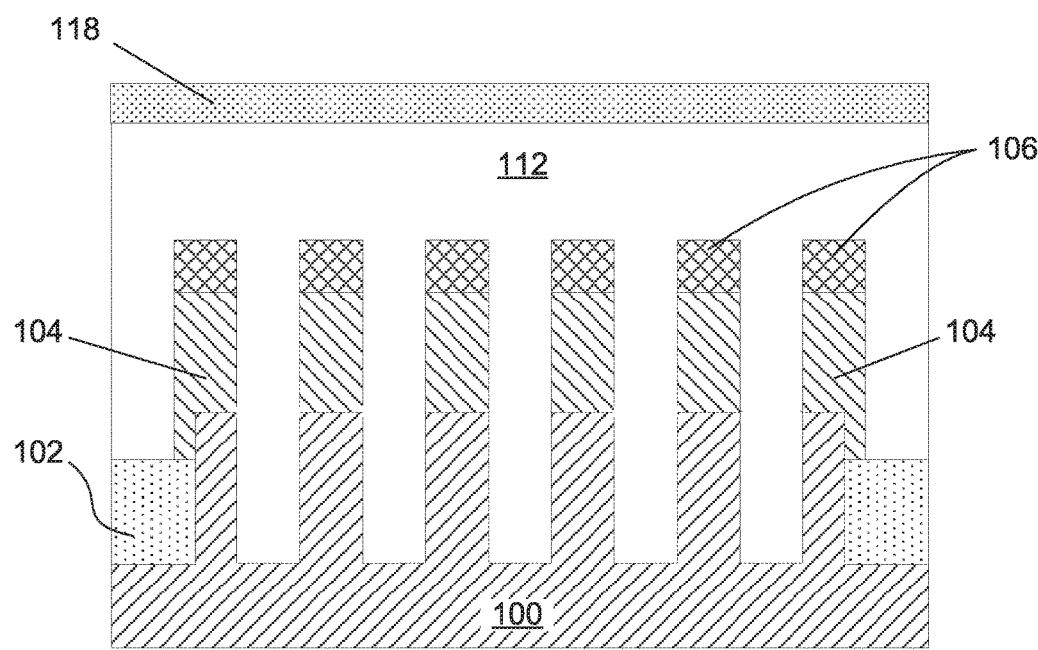

Referring now to FIGS. 11A-C, FIG. 11A depicts a plan view of the semiconductor device after the deposition of cap layer 118; FIG. 11B is a cross-sectional view of the semiconductor device after the deposition of cap layer 118, taken along the line 11B-11B of FIG. 11A; and FIG. 11C is a cross-sectional view of the semiconductor device after the deposition of cap layer 118, taken along the line 11C-11C of FIG. 11A. In this exemplary embodiment, cap layer 118 is deposited over the top surface of the semiconductor device and may act as an etch stop layer in subsequent processing steps. Cap layer 118 is composed of a thin (approximately 10 nm in thickness) nitride material.

Figure 12A:
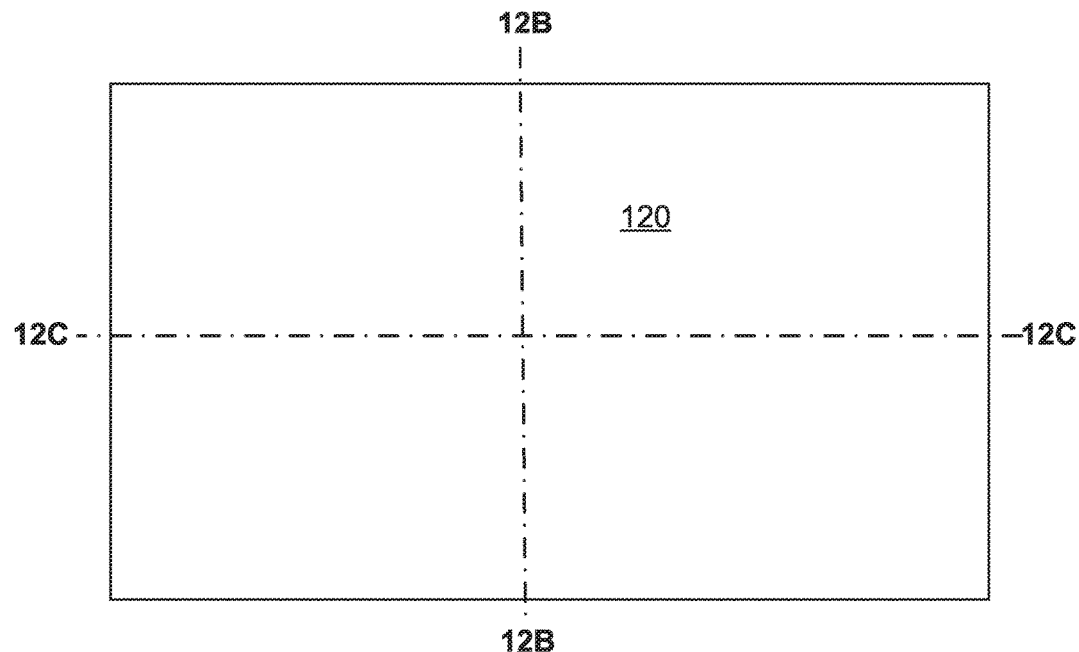
FIGS. 12A-C depict a plan view and cross-sectional views of the semiconductor device after the deposition of an oxide layer, in accordance with an embodiment of the present invention.
Figure 12B:
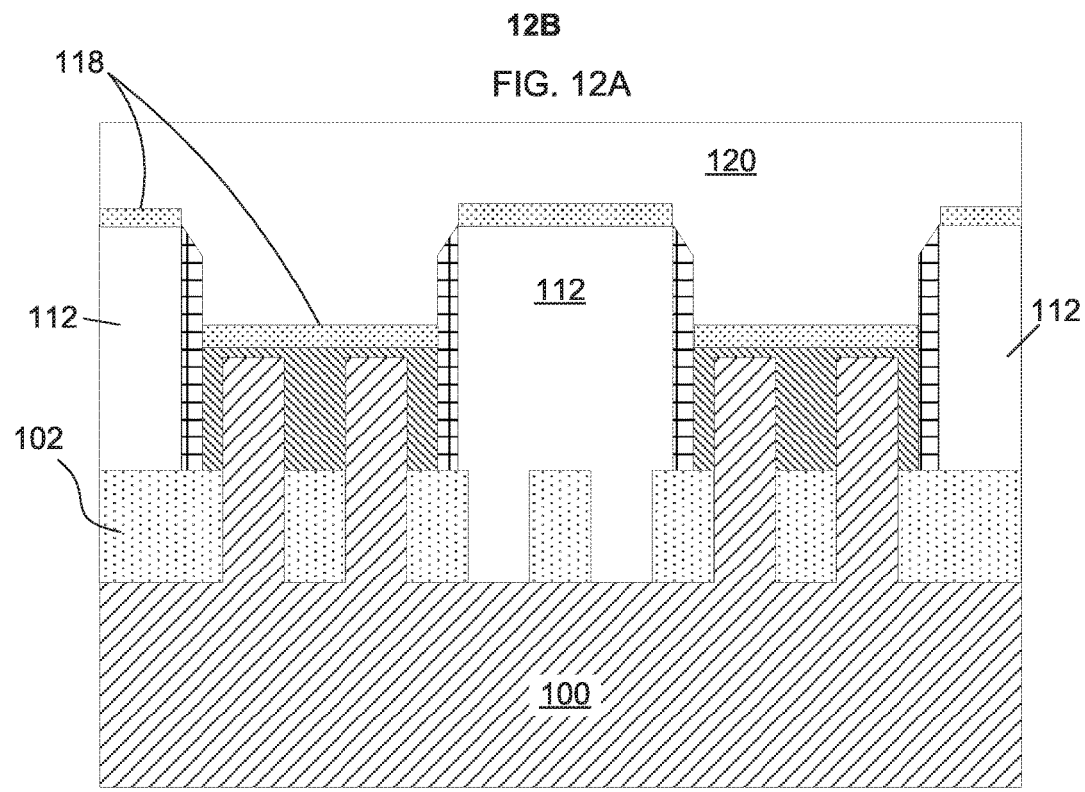
Figure 12C:
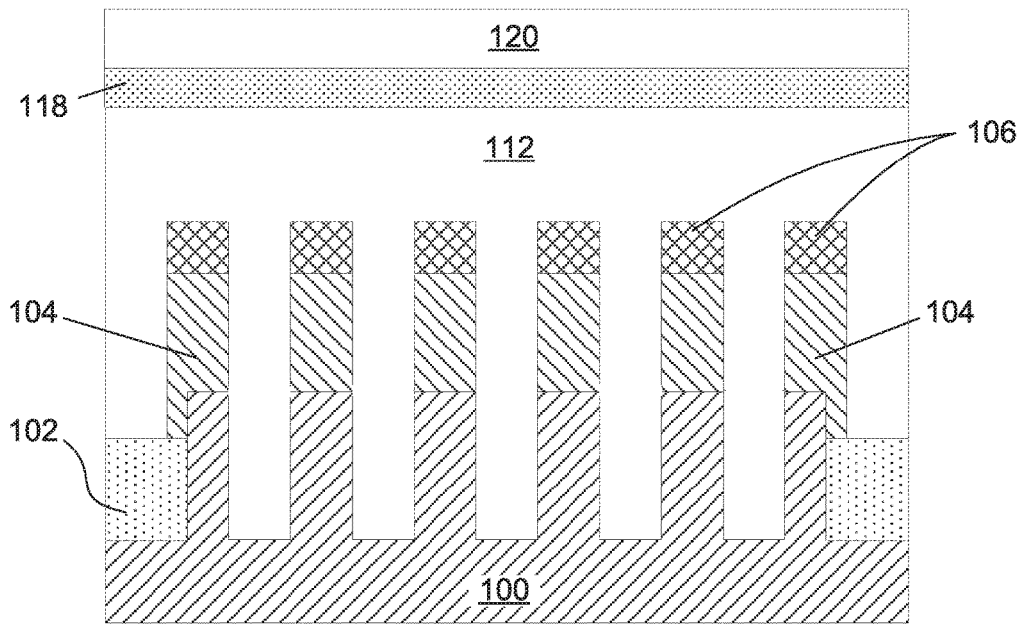

Referring now to FIGS. 12A-C, FIG. 12A depicts a plan view of the semiconductor device after the deposition of layer 120; FIG. 12B is a cross-sectional view of the semiconductor device after the deposition of layer 120, taken along the line 12B-12B of FIG. 12A; and FIG. 12C is a cross-sectional view of the semiconductor device after the deposition of layer 120, taken along the line 12C-12C of FIG. 12A. Layer 120 is deposited over the semiconductor device using a conventional deposition process, such as those listed above, and is subsequently planarized. Layer 120 may be composed of, for example, an oxide material. The planarization process is performed using a conventional planarization process such as chemical mechanical polishing (CMP) and/or grinding.

Figure 13A:
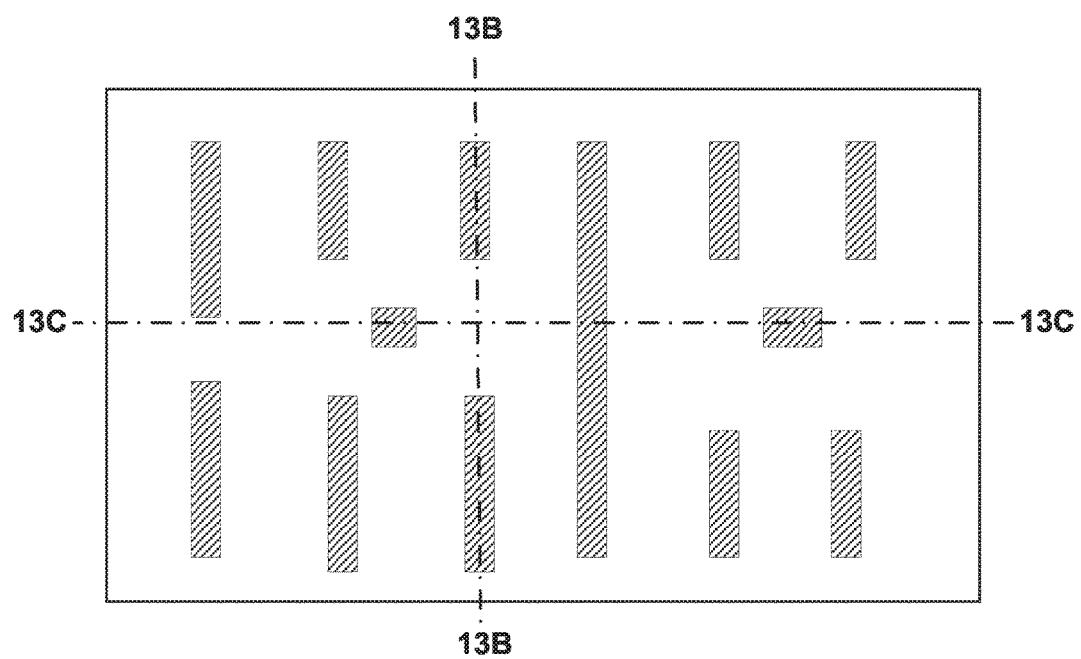
FIGS. 13A-C depict a plan view and cross-sectional views of the semiconductor device after the patterning of a contact hole and the deposition of metal contacts, in accordance with an embodiment of the present invention.
Figure 13B:
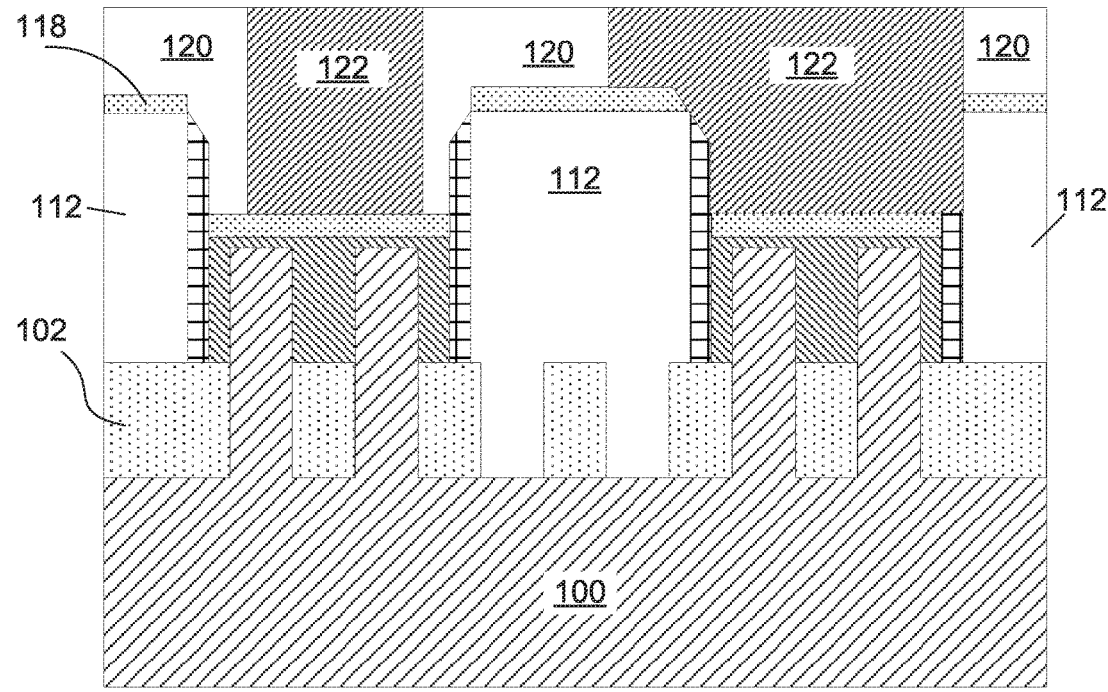
Figure 13C:
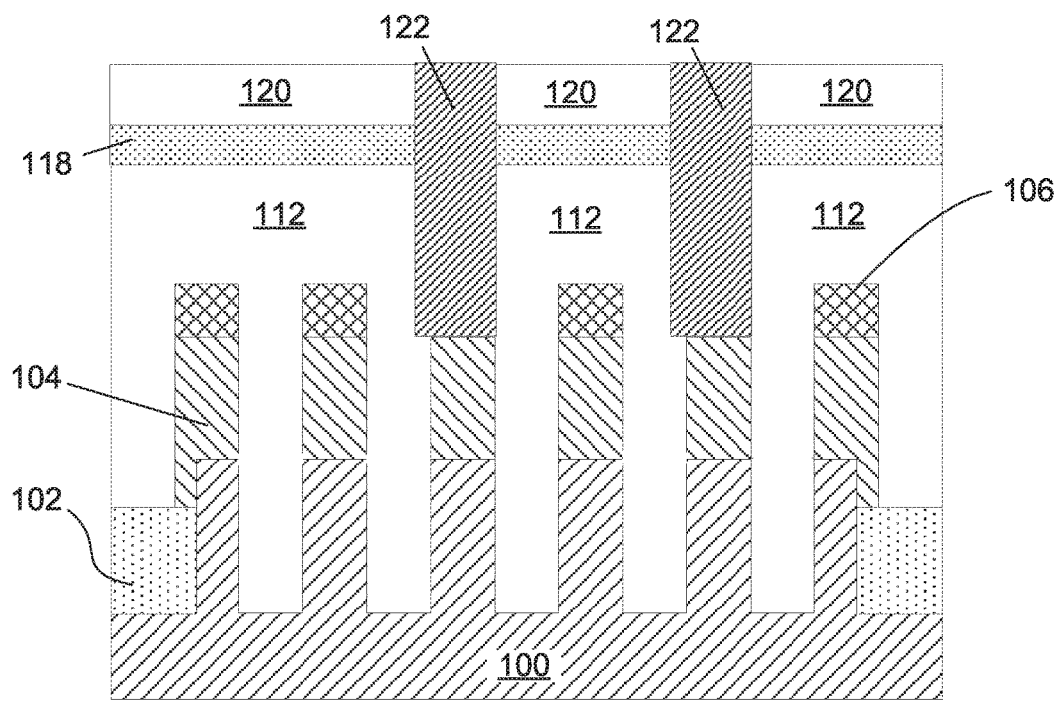

Referring now to FIGS. 13A-C, FIG. 13A depicts a plan view of the semiconductor device after the patterning of a contact hole and the deposition of contacts 122; FIG. 13B is a cross-sectional view of the semiconductor device after the patterning of a contact hole and the deposition of contacts 122, taken along the line 13B-13B of FIG. 13A; and FIG. 13C is a cross-sectional view of the semiconductor device after the patterning of a contact hole and the deposition of contacts 122, taken along the line 13C-13C of FIG. 13A. FIG. 13 shows the structure after contacts 122 formation. Contacts 122 are formed using standard techniques that are well-known to those skilled in the art. For example, contact openings (not depicted) are first formed into exposed portions of the fully grown epitaxial semiconductor layer (source and drain regions 116) using lithography and etching. After etching and removal of a resist material, a contact metal such as W, Cu, or Al, is deposited within the contact openings, using any suitable deposition process known in the art, to form contacts 122. After the completion of the semiconductor processing steps, contacts 122 are self-aligned and raised outside the active device area, reducing the coupling between gate structures 104 and contacts 122, thus allowing for reduced gate-to-contact parasitic capacitance. Contacts 122 are formed in same plane as the width of the semiconductor device (i.e., parallel to gate structures 104).

Having described embodiments for a FinFET device with low end parasitic capacitance and methods of fabrication (which are intended to be illustrative and not limiting), it is noted that modifications and variations may be made by persons skilled in the art in light of the above teachings. It is, therefore, to be understood that changes may be made in the particular embodiments disclosed which are within the scope of the invention as outlined by the appended claims.

In certain embodiments, the fabrication steps depicted above may be included on a semiconductor substrate consisting of many devices and one or more wiring levels to form an integrated circuit chip. The resulting integrated circuit chip(s) can be distributed by the fabricator in raw wafer form (that is, as a single wafer that has multiple, unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications, to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

What is claimed is:

1. A method for fabricating a semiconductor device comprising:
   providing a semiconductor substrate comprising a plurality of fins etched in the semiconductor substrate having a set of gate structures;
   creating device regions in the semiconductor substrate using shallow trench isolation (STI);
   filling the device regions with an insulator;
   planarizing the insulator;
   recessing the insulator, wherein the insulator has a thickness which is less than a height of the plurality of fins;
   depositing a first insulating material between the set of gate structures;
   selectively etching an active device area;
   depositing an oxide material over a top surface of the active device area;
   removing the first insulating material selective to the plurality of fins;
   forming a set of spacers adjacent to the set of gate structures;
   growing a doped source and drain region adjacent to the plurality of fins;
   depositing an etch stop layer over an upper surface of the deposited oxide material;
   depositing a second insulating material over an upper surface of the deposited etch stop layer; and
   depositing a metal within a contact opening to form a plurality of contacts.

2. The method of claim 1, wherein forming a set of gate structures comprises one of: atomic layer deposition (ALD), molecular layer deposition (MLD), chemical vapor deposition (CVD), and physical vapor deposition (PVD).

3. The method of claim 1, further comprising:
   depositing a hard mask over a top surface of the set of gate structures.

4. The method of claim 1, wherein the first insulating material comprises SiN.

5. The method of claim 1, wherein selectively etching the active device area comprises:
   patterning an upper surface of the first insulating material;
   depositing a resist material over the patterned first insulating material;
   etching the first insulating material selective, at least in part, to the deposited resist material; and
   removing the resist material from the patterned first insulating material.

6. The method of claim 1, wherein depositing an oxide material over the top surface of the active device area further comprises a planarization of the oxide material, wherein the planarization comprises chemical mechanical polishing (CMP) or grinding.

7. The method of claim 1, wherein removing the first insulating material selective to the plurality of fins comprises a hot phosphoric acid wet etch process.

8. The method of claim 1, wherein the plurality of contacts are formed parallel to the set of gate structures.

9. The method of claim 1, wherein the plurality of contacts are self-aligned.

10. A semiconductor structure comprising:
    a plurality of fins each having a respective source and drain region patterned in a starting semiconductor substrate;
    a set of gate structures formed on the starting semiconductor substrate;
    a set of spacers formed around each of the set of gate structures;
    an insulating material, wherein the insulating material is configured to be deposited over an upper surface of an active semiconductor device area; and
    a plurality of contacts, wherein a bottom surface of the plurality of contacts are positioned above the active semiconductor device area.

11. The semiconductor structure of claim 10, wherein the starting semiconductor substrate comprises one or more of: Si, III-V semiconductor materials, II-VI semiconductor materials, Ge, and SiGe.

12. The semiconductor structure of claim 10, wherein the plurality of contacts comprise one of: W, Cu, and Al.

13. The semiconductor structure of claim 10, wherein the plurality of contacts are self-aligned.

14. The semiconductor structure of claim 10, wherein the plurality of contacts are configured to be positioned parallel to the set of gate structures.

15. The semiconductor structure of claim 10, wherein the source and drain region is formed using an epitaxial growth process.

16. The semiconductor structure of claim 10, wherein the source and drain region is formed using a doped diode implantation process.

17. The semiconductor structure of claim 10, wherein the set of spacers comprise a nitride material.

18. The semiconductor structure of claim 10, wherein the set of gate structures comprise a dummy gate or an actual gate.

19. The semiconductor structure of claim 10, wherein the insulating material comprises an oxide material.

* * * * *